United States Patent
Baumer et al.

(10) Patent No.: US 8,873,688 B1
(45) Date of Patent: Oct. 28, 2014

(54) UNKNOWN RATE CLOCK RECOVERY FROM FIXED RATE TRANSMISSION SYSTEM

(75) Inventors: Howard Baumer, Laguna Hills, CA (US); Jatan Shah, Irvine, CA (US)

(73) Assignee: Entropic Communications, Inc., San Diego, CA (US)

( * ) Notice: Subject to any disclaimer, the term of this patent is extended or adjusted under 35 U.S.C. 154(b) by 537 days.

(21) Appl. No.: 12/964,648

(22) Filed: Dec. 9, 2010

Related U.S. Application Data

(60) Provisional application No. 61/285,530, filed on Dec. 10, 2009.

(51) Int. Cl.
*H04L 7/00* (2006.01)
*H03M 7/00* (2006.01)

(52) U.S. Cl.
CPC .. *H04L 7/00* (2013.01); *H03M 7/00* (2013.01)
USPC ............................................. 375/354; 341/61

(58) Field of Classification Search
CPC .................................... H04L 7/00; H03M 7/00
USPC .......................... 375/295, 316, 354, 371, 372
See application file for complete search history.

(56) References Cited

U.S. PATENT DOCUMENTS

2009/0116508 A1* 5/2009 Kobayashi et al. ........... 370/465
2010/0008385 A1* 1/2010 Noronha, Jr. ................. 370/545

* cited by examiner

*Primary Examiner* — Kevin M Burd
(74) *Attorney, Agent, or Firm* — Richard Bachand; KPPB LLP

(57) ABSTRACT

Systems and methods for transmitting data having a rate indicated by an associated clock signal, using a fixed rate transmission system are disclosed. One embodiment of the invention includes an unknown rate to fixed rate transmitter configured to receive unknown rate data and a clock signal that indicates the rate of the unknown rate data, and to transmit data at a fixed rate over a fixed rate link, a fixed rate to unknown rate receiver configured to receive fixed rate data including the unknown rate data via the fixed rate link, and to transmit the unknown rate data, and a recovered clock signal. In addition, the unknown rate to fixed rate transmitter is configured to insert idle data between the fixed rate data so that transmitting the combined unknown rate and idle data at the fixed rate over the fixed rate link results in the unknown rate data being transmitted over the fixed rate link at a rate corresponding to the rate indicated by the clock signal, and the fixed rate to unknown rate receiver is configured to accumulate the unknown rate data and generate a recovered clock signal based upon the rate at which the unknown rate data is accumulated by the fixed rate to unknown rate receiver.

19 Claims, 3 Drawing Sheets

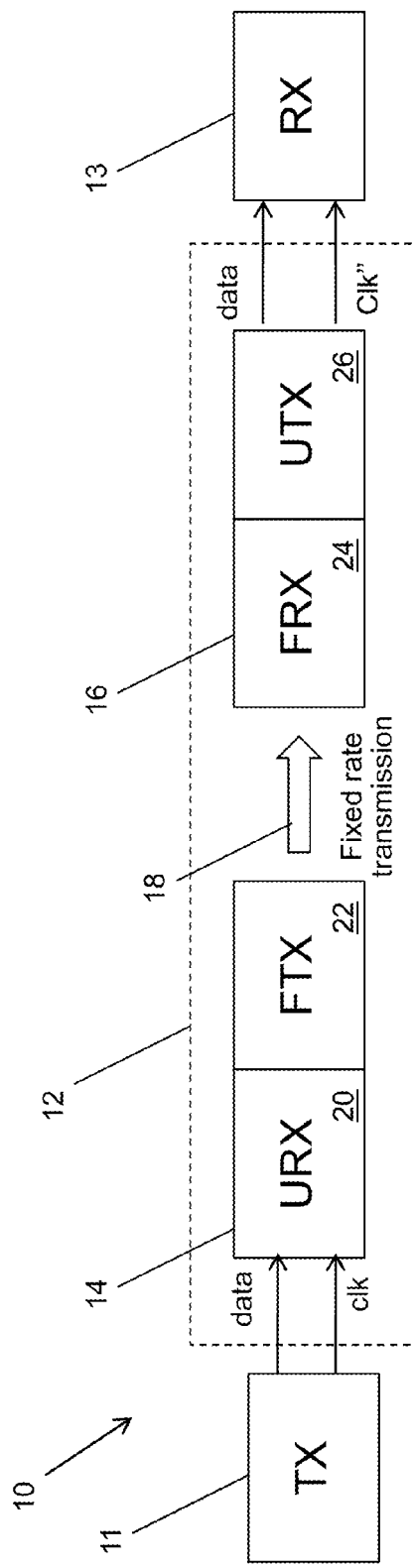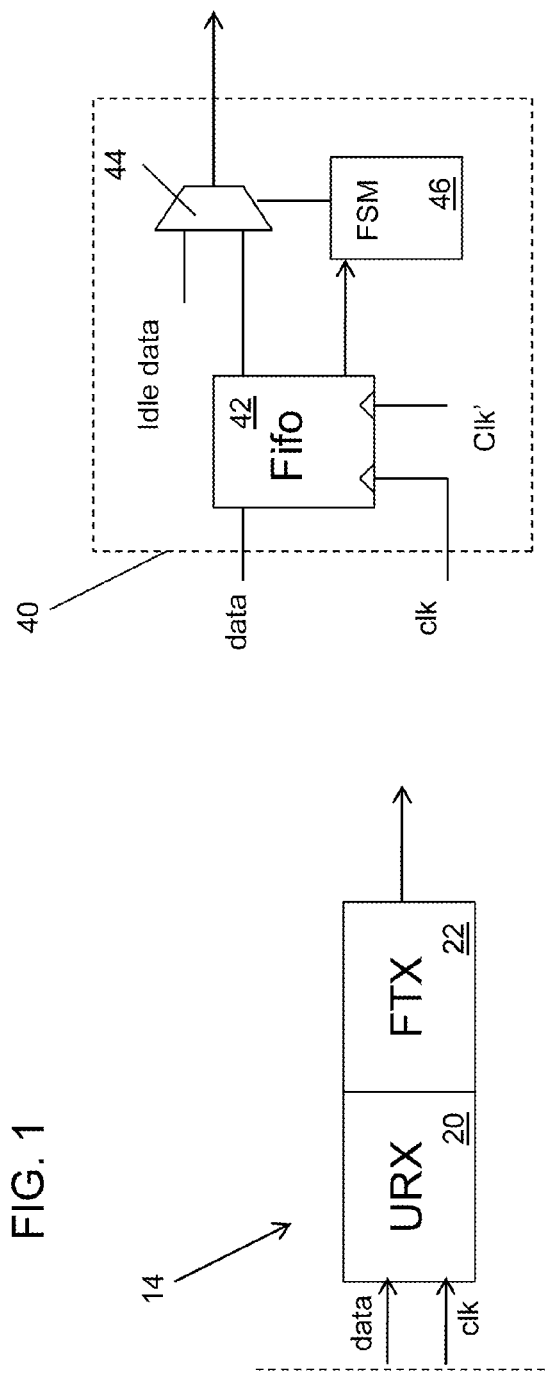

UNKNOWN RATE CLOCK RECOVERY FROM FIXED RATE TRANSMISSION SYSTEM

RELATED APPLICATION

This application claims priority to provisional application No. 61/285,530 filed Dec. 10, 2009, the disclosure of which is incorporated herein by reference.

BACKGROUND

The present invention relates generally to digital data transmission and more specifically to transmission of data at different rates over a fixed rate transmission system.

A number of high-speed digital interface standards exist that support variable data rates. The term variable data rate references the fact that the standard does not fix a specific rate for data transmission. Other digital interface standards, limit the rates at which data can be transmitted between a number of fixed rates. Due to the fact the data rate is unknown to the receiver in such digital interface standards, a clock signal is typically provided to enable synchronization between the transmitter and receiver. Therefore, a device utilizing a digital interface standard, where the data rate is unknown to the receiver, typically transmits data at a fixed rate indicated by a clock signal provided by the device. A receiver can then be configured to receive the data at the rate indicated by the clock signal. Examples of variable data rate digital interface standards include the High Definition Multimedia Interface (HDMI) promoted by HDMI Licensing, LLC of Sunnyvale Calif. and the Digital Visual Interface (DVI) standard developed by the Digital Display Working Group of Vancouver, Wash. Examples of digital interface standards that specify a number of allowed data rates include the Display Port standard issued by the Video Electronics Standards Association of Milpitas, Calif.

Signal attenuation limits the length of cable over which a signal can be transmitted. In many instances, an optic fiber link can be used to increase the distance over which data can be transmitted. The transmission of variable rate data using a fixed rate transmission system, such as a transmission system including an optic fiber link, can be problematic. A clock signal matched to the rate of the data is required for a receiver to receive variable rate data and fixed rate systems typically do not provide support for transmission of the clock signal.

SUMMARY OF THE INVENTION

Systems and methods are described for transmitting data from different sources with different rates or from an unknown rate system using a fixed rate transmission system. In many embodiments, the transmission system includes an unknown rate to fixed rate transmitter and a fixed rate to unknown rate receiver. The unknown rate to fixed rate transmitter receives data via a digital interface standard at a rate determined by an associated clock signal and transmits the received data over a fixed rate link. The unknown rate to fixed rate transmitter typically inserts additional data so that the received unknown rate data is transmitted on the fixed rate link at the same rate at which it is received by the unknown rate to fixed rate transmitter. The fixed rate to unknown rate receiver can use the rate at which the unknown rate data is received over the fixed rate link to reproduce a clock corresponding to the output data rate.

One embodiment of the invention includes an unknown rate to fixed rate transmitter configured to receive unknown rate data and a clock signal that indicates the rate of the unknown rate data, and to transmit data at a fixed rate over a fixed rate link, a fixed rate to unknown rate receiver configured to receive fixed rate data including the unknown rate data via the fixed rate link, and to transmit the unknown rate data, and a recovered clock signal. In addition, the unknown rate to fixed rate transmitter is configured to insert idle data between the fixed rate data so that transmitting the combined unknown rate and idle data at the fixed rate over the fixed rate link results in the unknown rate data being transmitted over the fixed rate link at a rate corresponding to the rate indicated by the clock signal, and the fixed rate to unknown rate receiver is configured to accumulate the unknown rate data and generate a recovered clock signal based upon the rate at which the unknown rate data is accumulated by the fixed rate to unknown rate receiver.

In a further embodiment of the invention, the unknown rate to fixed rate transmitter includes an unknown rate receiver including an analog front end and circuitry configured to receive input signals transmitted in accordance with a predetermined digital interface standard, and to decode the received signals to obtain the received unknown rate data, and a fixed rate transmitter including circuits configured to receive the unknown rate data and the clock signal indicating the rate of the unknown rate data, and to insert idle data between the unknown rate data to create a data sequence combining the unknown rate data and the idle data. In addition, the unknown rate receiver is configured to provide the decoded unknown rate data and the associated clock signal to the fixed rate transmitter, and the fixed rate transmitter further includes circuits configured to encode and transmit the data sequence combining the unknown rate data and the idle data via the fixed rate link.

In another embodiment of the invention, the fixed rate transmitter includes a first in first out (FIFO) queue into which the unknown rate data is clocked in accordance with the clock signal, and a multiplexer controlled by a finite state machine, which receives the output of the FIFO queue as an input and an idle data input. In addition, the fixed rate transmitter is configured to clock the unknown rate data out of the FIFO queue at the rate of the fixed rate link, the finite state machine is configured to cause the multiplexer to select data clocked out of the FIFO queue, when there is data in the FIFO queue, and the finite state machine is configured to cause the multiplexer to select the idle data sequence, when the FIFO queue is empty.

In a still further embodiment of the invention, the fixed rate to unknown rate receiver includes a fixed rate receiver including an analog front end and decoder circuitry configured to decode the fixed rate data sequence received by the fixed rate to unknown rate receiver to obtain the data sequence including the combined unknown rate and idle data, and a configurable transmitter including circuitry configured to receive the decoded data sequence, accumulate the unknown rate data and generate a recovered clock signal based upon the rate at which the unknown rate data is accumulated. In addition, the fixed rate receiver is configured to provide the decoded data sequence to the configurable transmitter, and the configurable transmitter includes circuitry configured to encode and transmit the accumulated unknown rate data at a rate corresponding to the rate indicated by the recovered clock signal.

In still another embodiment of the invention, the configurable transmitter includes a FIFO queue, and a phase lock loop. In addition, the configurable transmitter is configured to accumulate the unknown rate data in the FIFO queue, and the configurable transmitter is configured to utilize the phase lock loop to generate the recovered clock signal based upon the rate at which the unknown rate data accumulates in the FIFO queue, and the configurable transmitter is configured to clock data out of the FIFO queue at the rate indicated by the recovered clock signal.

In a yet further embodiment, the phase lock loop is configured to control the rate of the recovered clock signal based upon whether the amount of unknown rate data accumulated in the FIFO queue is increasing or decreasing.

In yet another embodiment, the configurable transmitter further includes a second FIFO queue, and a second phase lock loop. In addition, the configurable transmitter is configured to load the unknown rate data clocked out of the first FIFO queue into the second FIFO queue, the configurable transmitter is configured to utilize the second phase lock loop to smooth the recovered clock signal, and the configurable transmitter is configured to clock the unknown rate data out of the second FIFO queue at the rate indicated by the smoothed clock signal.

In a further embodiment again, the second phase lock loop is implemented as a low jitter clock interpolator.

In another embodiment again, the configurable transmitter is configured to reformat the received unknown rate data prior to encoding the reformatted unknown rate data.

A further additional embodiment includes an unknown rate receiver including an analog front end and circuitry configured to receive input signals transmitted in accordance with a predetermined digital interface standard, and to decode the received signals to obtain unknown rate data and a clock signal that indicates the rate of the unknown rate data, and a fixed rate transmitter including circuits configured to receive the unknown rate data and the clock signal, and to insert idle data between the unknown rate data so that transmitting the combined unknown rate and idle data at a fixed rate results in the unknown rate data being transmitted at a rate corresponding to the rate indicated by the clock signal. In addition, the unknown rate receiver is configured to provide the decoded unknown rate data and the clock signal to the fixed rate transmitter, and the fixed rate transmitter further includes circuits configured to encode and transmit the combined unknown rate and idle data at the fixed rate.

In another additional embodiment, the fixed rate transmitter includes a FIFO queue into which the unknown rate data is clocked in accordance with the clock signal, and a multiplexer controlled by a finite state machine, which receives the output of the FIFO queue as an input and an idle data input. In addition, the fixed rate transmitter is configured to clock the unknown rate data out of the FIFO queue at the fixed rate, the finite state machine is configured to cause the multiplexer to select data clocked out of the FIFO queue, when there is data in the FIFO queue, and the finite state machine is configured to cause the multiplexer to select the idle data sequence, when the FIFO queue is empty.

A still yet further embodiment includes a fixed rate receiver including an analog front end and decoder circuitry configured to receive and decode a fixed rate data sequence including unknown rate and idle data, and a configurable transmitter including circuitry configured to receive the data sequence, accumulate the unknown rate data, and generate a recovered clock signal based upon the rate at which the unknown rate data is accumulated. In addition, the fixed rate receiver is configured to provide the decoded data sequence to the configurable transmitter, and the configurable transmitter includes circuitry configured to encode and transmit the accumulated unknown rate data at a rate corresponding to the rate indicated by the recovered clock signal.

In still yet another embodiment, the configurable transmitter includes a FIFO queue, and a phase lock loop. In addition, the configurable transmitter is configured to accumulate the unknown rate data in the FIFO queue, the configurable transmitter is configured to utilize the phase lock loop to generate the recovered clock signal based upon the rate at which the unknown rate data accumulates in the FIFO queue, and the configurable transmitter is configured to clock data out of the FIFO queue at the rate indicated by the recovered clock signal.

In a still further embodiment again, the phase lock loop is configured to control the rate of the recovered clock signal based upon whether the amount of unknown rate data accumulated in the FIFO is increasing or decreasing.

In still another embodiment again, the configurable transmitter further includes a second FIFO queue, and a second phase lock loop. In addition, the configurable transmitter is configured to load the unknown rate data clocked out of the first FIFO queue into the second FIFO queue, the configurable transmitter is configured to utilize the second phase lock loop to smooth the recovered clock signal, and the configurable transmitter is configured to clock the unknown rate data out of the second FIFO queue at the rate indicated by the smoothed recovered clock signal.

In a yet further embodiment again, the second phase lock loop is implemented as a low jitter clock interpolator.

In yet another embodiment again, the configurable transmitter is configured to reformat the received unknown rate data prior to encoding the reformatted unknown rate data.

An embodiment of the method of the invention includes receiving the unknown rate data and the associated clock signal at an unknown rate to fixed rate transmitter, inserting idle data between the unknown rate data, wherein transmission of the combined unknown rate and idle data at the fixed rate results in the unknown rate data being transmitted over the fixed rate link at a rate corresponding to the rate indicated by the clock signal, transmitting the combined unknown rate and idle data at a fixed rate over the fixed rate link using the unknown rate to fixed rate transmitter, receiving the combined unknown rate and idle data at a fixed rate to unknown rate receiver, accumulating the unknown rate data at the fixed rate to unknown rate receiver, recovering a clock signal based upon the rate at which the unknown rate data is received by the fixed rate to unknown rate receiver, and transmitting the unknown rate data and the recovered clock signal using the fixed rate to unknown rate receiver.

In a further embodiment of the method of the invention, the unknown rate to fixed rate transmitter comprises a FIFO queue and a multiplexer configured to select between the output of the FIFO queue and an idle data sequence, the method further including clocking the unknown rate data into the FIFO queue in accordance with the clock signal, clocking the unknown rate data out of the FIFO queue at the rate of the fixed rate link, selecting the output of the FIFO queue as the output of the multiplexer when there is data in the FIFO queue, and selecting the idle data sequence as the output of the multiplexer when there is no data in the FIFO queue.

In another embodiment of the method of the invention, the fixed rate to unknown rate receiver comprises a FIFO queue and a phase lock loop configured to generate a clock signal based upon the rate at which data accumulates in the FIFO queue, the method further including accumulating the unknown rate data in the FIFO queue, recovering a clock signal based upon the rate at which data accumulates in the FIFO queue using the phase lock loop, and clocking data out of the FIFO queue using the recovered clock signal.

In a still further embodiment of the invention, the fixed rate to unknown rate receiver comprises a second FIFO queue and a second phase lock loop configured to reduce jitter in an input clock signal, further including clocking the data from the first FIFO queue into the second FIFO queue using the recovered clock signal, generating a smoothed clock signal using the second phase lock loop, and clocking the data out of the second FIFO queue using the smoothed clock signal.

BRIEF DESCRIPTION OF THE DRAWINGS

FIG. 1 is a block diagram illustrating a communication system in accordance with an embodiment of the invention.

FIG. 2 is a block diagram illustrating an unknown rate to fixed rate transmitter in accordance with an embodiment of the invention.

FIG. 3 is a block diagram illustrating an unknown rate to fixed rate converter in accordance with an embodiment of the invention.

DETAILED DESCRIPTION OF THE DRAWINGS

Figure 4:
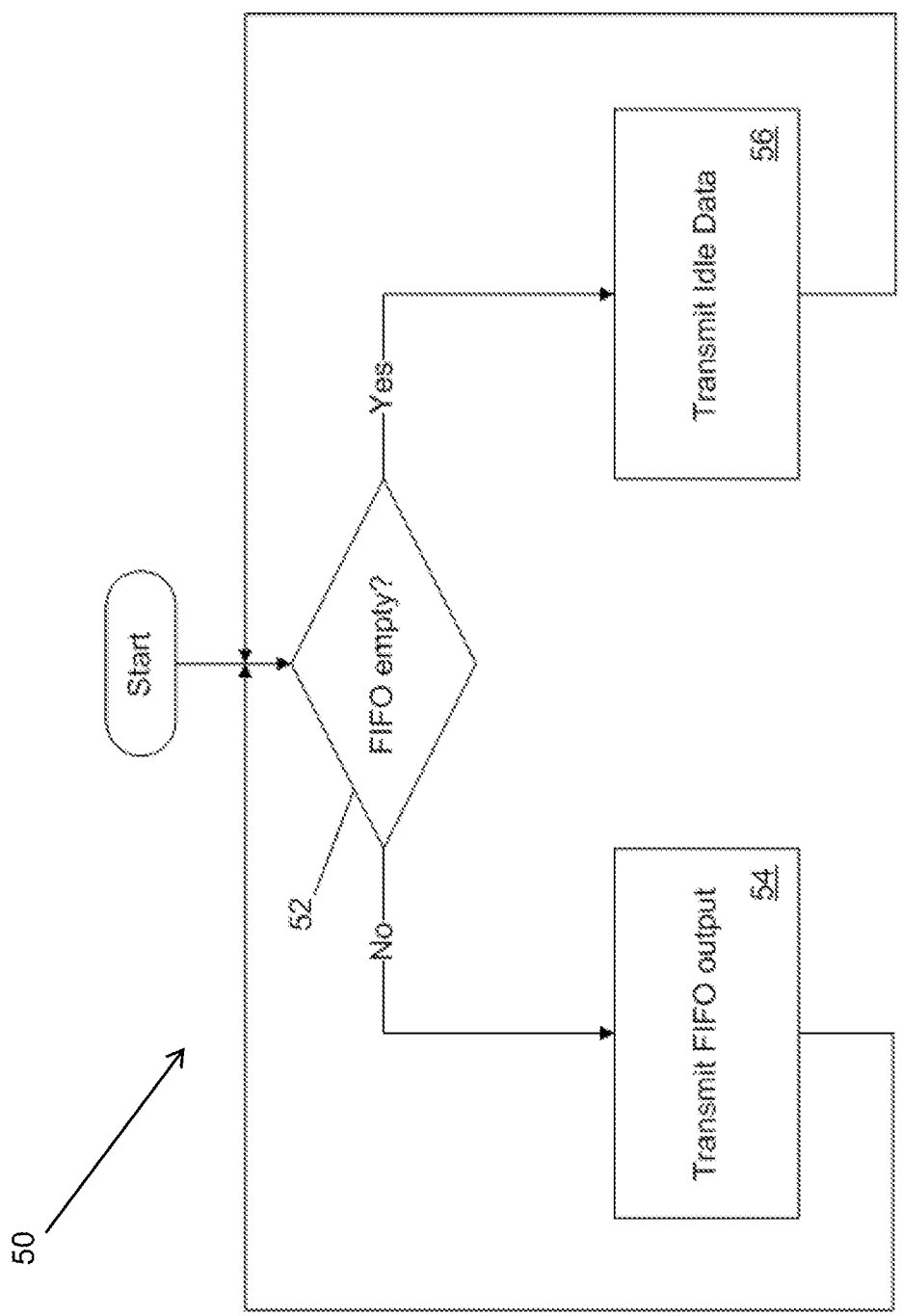
FIG. 4 is a flow chart illustrating the operation of a finite state machine of an unknown rate to fixed rate converter in accordance with an embodiment of the invention.

Turning now to the drawings, systems and methods for transmitting data having a rate indicated by an associated clock signal, using a fixed rate transmission system are illustrated. In many embodiments, a transmission system is utilized that incorporates an unknown rate to fixed rate (URFR) transmitter and a fixed rate to unknown rate (FRUR) receiver. The URFR transmitter is configured to receive data and a clock signal in accordance with a predetermined digital interface standard. The rate at which the data is received is not predetermined or fixed. Instead, the data rate is unknown and the URFR relies upon the associated clock signal for the rate of the received data. The URFR transmitter is configured to transmit the received data, which can be referred to as unknown rate data, at a fixed rate. In order to enable, the FRUR receiver to determine the rate of the unknown rate data, the URFR transmitter inserts data so that the unknown rate data is transmitted on the fixed rate link at the rate at which it is received by the URFR transmitter (i.e. the rate of the unknown rate data is preserved during the higher speed fixed rate transmission due to the insertion of data between the unknown rate data). The FRUR transmitter reproduces the clock of the unknown rate data based upon the rate at which the unknown rate data is received via the fixed rate link and outputs the unknown rate data in accordance with the predetermined digital interface standard. In several embodiments, the URFR transmitter inserts idle data into the transmitted data sequence to match the rate at which the unknown rate data is transmitted by the fixed rate transmission system to the rate at which the URFR transmitter received the unknown rate data. In many embodiments, the URFR inserts useful data into the transmitted data sequence to match the rate of the unknown rate data. The FRUR transmitter then can recover the clock of the unknown rate data based upon the rate at which the unknown rate data is received via the fixed rate transmission system. In a number of embodiments, the FRUR utilizes a novel PLL that reproduces the clock of the unknown rate data based upon the rate at which the unknown rate data accumulates in a FIFO queue. In several embodiments, the reproduced clock is further smoothed using a second PLL.

Various embodiments of transmission systems, URFR transmitters, and FRUR receivers in accordance with embodiments of the invention are discussed below.

Transmission System Architecture

A communication system including a fixed rate transmission system connecting a transmitter configured to transmit data at an unknown rate with a receiver configured to receive data at an unknown rate in accordance with an embodiment of the invention is illustrated in FIG. 1. The communication system 10 includes a transmitter 11 that outputs data in accordance with a digital interface standard, where the data is accompanied by a clock signal (clk) that defines the data rate of the transmitter. The output of the transmitter 11 is provided as an input to a fixed rate transmission system 12, which provides the data and a reproduced clock (Clk") as the input to a receiver configured to receive data in accordance with the digital interface standard.

Fixed rate transmission systems in accordance with embodiments of the invention include a URFR transmitter 14 and a FRUR receiver 16. In many embodiments, the URFR transmitter 14 is configured to receive data transmitted in accordance with a predetermined variable rate digital interface standard. In several embodiments, the URFR transmitter is configured to receive data transmitted by transmitters that transmit at different data rates. The URFR transmitter inserts data so that the received data is transmitted at the rate it is received by the URFR over the higher data rate fixed rate transmission system. In a number of embodiments, the data rate of the fixed transmission system is the same data rate or higher than the maximum rate permitted by the digital interface standard. Examples of fixed rate links 18 over which the data can be transmitted include but are not limited to systems that transmit in accordance with the 10 Gigabit Ethernet standard over optic fibers, and any of a variety of different high speed wireless communication technologies.

The FRUR receiver 16 is configured to receive the data sequence at the fixed rate transmitted by the URFR transmitter 14 and to reproduce the clock signal (clk) with low jitter from additional data inserted into the data sequence by the URFR transmitter 14. The FRUR receiver 16 outputs the unknown rate data received by the URFR transmitter at a rate determined by the accompanying reproduced clock (Clk").

Transmitting data received at an unknown rate over a fixed rate transmission system in the manner outlined above can significantly extend the distance over which the unknown rate data can be transmitted. This is particularly true for digital interface standards that are specified with a view to transmission of data over cables. Signal attenuation can provide an upper limit on the distance over which data can be transmitted using a cable. Fixed data rate transmission systems include systems, such as optic fiber transmission systems, that are configured to transmit data over vast distances. Therefore, transmission systems in accordance with embodiments of the invention can enable the transmission of unknown rate data over significantly longer distances than would otherwise be supported using optic fibers, and other longer distance communication links such as wireless communication links.

URFR Transmitter Architecture

A URFR transmitter in accordance with an embodiment of the invention is illustrated in FIG. 2. The URFR transmitter can be considered to include an unknown rate receiver 20 and a fixed rate transmitter 22. The unknown rate receiver 20 includes an analog front end and circuitry configured to receive input signals transmitted in accordance with a predetermined digital interface standard, and decode the received signals to obtain the received unknown rate data. The unknown rate data and the associated clock signal (clk) are provided to the fixed rate transmitter 22, which generates a data sequence including both the unknown rate data and inserted data indicative of the rate of the transmitted data. The fixed rate transmitter 22 provides the data sequence to circuits configured to encode and transmit the data sequence at a fixed data rate.

A URFR converter configured to receive an input data sequence at a rate indicated by an associated clock signal and to produce a fixed rate data sequence in accordance with an embodiment of the invention is illustrated in FIG. 3. The URFR converter 40 includes a FIFO 42 into which the unknown rate data is clocked in accordance with the clock signal (clk). The unknown rate data is clocked out of the FIFO 42 at the fixed data rate (Clk') of the transmission system, which is typically at higher rate than the rate at which data is clocked into the FIFO 42. The data clocked out of the FIFO 42 is provided to a multiplexer 44. The multiplexer 44 includes a second input, from which an idle data sequence or other useful data can be passed through the multiplexer. A finite state machine (FSM) 46 determines the output data sequence by using the multiplexer to select between the data clocked out of the FIFO and the idle data sequence. Various ways in which the FSM can select between the output of the FIFO and one or more idle data sequences are disclosed in U.S. patent application Ser. No. 12/552,240 entitled "Systems and Methods of Digital Interface Translation" filed Sep. 1, 2009, the disclosure of which is incorporated herein by reference in its entirety.

A flow chart illustrating a state machine utilized in a URFR converter in accordance with an embodiment of the invention is illustrated in FIG. 4. The process 50 determines (52) whether the FIFO is empty. In the event that the FIFO is empty, the FSM provides (54) an address to the multiplexer that results in the transmission of the Idle Data sequence. In the event that data is available in the FIFO, then the FSM provides (56) an address to the multiplexer that selects the output of the FIFO for transmission.

Although a specific process is illustrated in FIG. 4, other circuits and/or implementations of finite station machines that satisfy the requirements of a specific application can be utilized in accordance with embodiments of the invention. In addition, alternative URFR converters that receive a input data sequence transmitted at an unknown rate and a clock signal and produce a fixed rate data sequence from which the clock signal can be reproduced also can be utilized in accordance with embodiments of the invention.

FRUR Receiver Architecture

Figure 5:
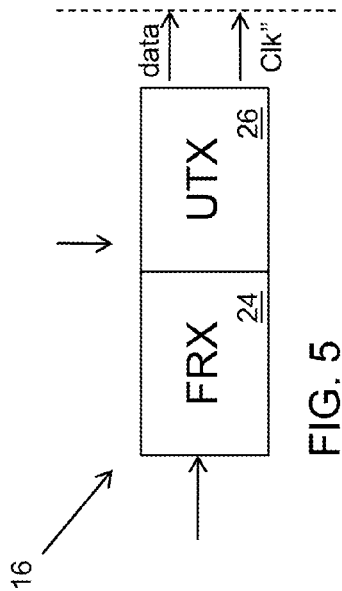
FIG. 5 is block diagram illustrating a fixed rate to unknown rate converter in accordance with an embodiment of the invention.

A FRUR receiver in accordance with an embodiment of the invention is illustrated in FIG. 5. The FRUR receiver 16 can be considered to include a fixed rate receiver 24 and a configurable or unknown rate transmitter 26. The fixed rate receiver 24 includes an AFE and decoder circuitry configured to decode the fixed rate data sequence received by the FRUR receiver. The data sequence includes the unknown rate data originally received by the URFR transmitter and data inserted into the data sequence by the URFR transmitter to provide information concerning the rate at which the unknown rate data was received. The data sequence is provided to the unknown rate transmitter 26, which reproduces the clock signal (clk) received by the URFR transmitter using the data inserted into the received data sequence by the URFR transmitter. The unknown rate transmitter also includes circuitry and an AFE capable of outputting the unknown rate data originally received by the URFR transmitter and the reproduced clock signal (Clk") in accordance with the predetermined digital interface standard originally used to transmit the unknown rate data, and at a rate determined by the reproduced clock. In many embodiments, the unknown rate data can be reformatted and output using a different digital interface standard.

Figure 6:
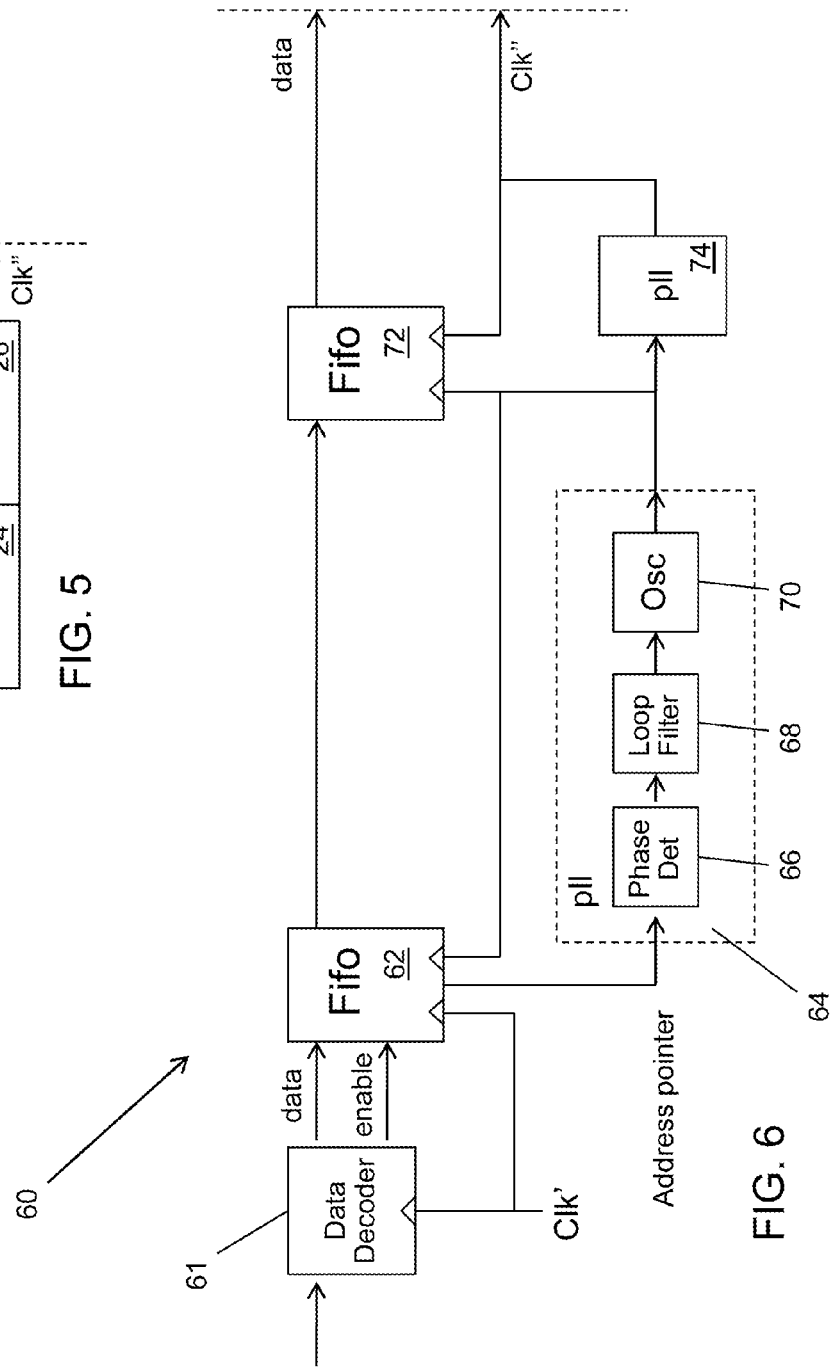
FIG. 6 is a block diagram illustrating a fixed rate to unknown rate converter in accordance with an embodiment of the invention.

A FRUR converter that receives as an input a data sequence at a fixed rate, and is configured to reproduce a clock signal and provide as outputs received data at a rate determined by the reproduced clock, and the reproduced clock in accordance with an embodiment of the invention is illustrated in FIG. 6. The FRUR converter 60 includes a data decoder 61 that receives a data sequence at a fixed data rate, where the data sequence includes the unknown rate data originally received by a URFR transmitter and additional data inserted into the data sequence by the URFR transmitter. The data decoder 61 determines whether data in the sequence is unknown rate data or inserted data. When the data is unknown rate data, the data decoder generates an enable signal and the data is clocked into a FIFO 62. When the data is inserted data, the data decoder does not provide an enable signal to the FIFO 62 and the additional data is not clocked into the FIFO 62. The clock signal that is used to clock data into the FIFO 62 is the clock of the fixed rate transmission system.

Data is clocked out of the FIFO 62 in accordance with a clock signal that is generated by monitoring whether the amount of data queued in the FIFO 62 is growing or shrinking. Only the unknown rate data is loaded into the FIFO and, due to the inserted data in the received data sequence, the unknown rate data is loaded into the FIFO at the average rate in which the unknown rate data was originally received by the URFR transmitter. Therefore, matching the reproduced clock to the average rate at which data is loaded into the FIFO 62 can reproduce the original clock signal of the unknown rate data. If the amount of data in the FIFO 62 increases, then the reproduced clock rate is too slow and should also increase. If the amount of data in the FIFO 62 decreases, then the reproduced clock rate is too fast and should be decreased.

In the illustrated embodiment, the original clock signal is reproduced using a variant of a phase lock loop (PLL) 64 in accordance with an embodiment of the invention. The variant of a PLL 64 includes a phase detector 68 that monitors the difference in the addresses between the address in which the most recent piece of data was loaded into the FIFO 62 and the address from which the most recent piece of data was read out of the FIFO 62 and compares the difference to a fixed value. In a number of embodiments, the FIFO is preloaded with a sufficient number of leading data so that the initial difference is equal to the fixed value. In other embodiments, the FIFO can be implemented in any a variety of ways including but not limited to elastic or circular buffers, or shift registers and the PLL implemented accordingly. In a number of embodiments, the phase detector 64 outputs a value which indicates whether the amount of unknown rate data accumulating in the FIFO 62 is increasing or decreasing. In many embodiments, the phase detector 64 outputs either +1 or −1 depending upon whether the amount of accumulated unknown rate data is increasing or decreasing. The output of the phase detector 66 is provided to a loop filter 68 and an oscillator 70 to reproduce an initial estimate of the clock signal originally received by the URFR transmitter. The loop filter 68 and the oscillator 70 can be implemented in accordance with the equivalent blocks of any conventional PLL.

In the illustrated embodiment, the reproduced clock and the data rate of the unknown rate data is further smoothed by loading the unknown rate data into a second FIFO 72 and loading the data out of the second FIFO 72 using a clock signal (Clk") generated by passing the initial estimate of the clock signal through a PLL 74. In many embodiments, the PLL can be implemented as a low jitter clock interpolator similar to the low jitter clock interpolators described in U.S. Provisional Patent Application No. 61/324,017 entitled "Low Jitter Clock Interpolator" filed Apr. 14, 2010, the disclosure of which is hereby incorporated by reference in its entirety. In other embodiments, other implementations of phase lock loops can be utilized. The data loaded out of the second FIFO 72 and the reproduced clock signal (Clk") are matched with low jitter to the rate at which unknown rate data was originally received by the URFR transmitter and can be output by the transmission system in accordance with the appropriate data interface standard. Although a PLL is used to smooth the initial estimate of the original clock signal in the embodiment illustrated in FIG. 6, any of a variety of techniques appropriate to a specific application can be used to smooth the reproduced clock and the rate of the output unknown rate data in accordance with embodiments off the invention.

While the above description contains many specific embodiments of the invention, these should not be construed as imitations on the scope of the invention, but rather as an example of one embodiment thereof. Accordingly, the scope of the invention should be determined not by the embodiments illustrated, but by the appended claims and their equivalents.

What is claimed:

1. A system for transmitting unknown rate data over a fixed rate link, comprising:
    an unknown rate to fixed rate transmitter configured to receive unknown rate data and a clock signal that indicates the rate of the unknown rate data, and to transmit fixed rate data at a fixed rate over a fixed rate link; and
    a fixed rate to unknown rate receiver configured to receive the fixed rate data including the unknown rate data via the fixed rate link, and to transmit the unknown rate data and a recovered clock signal;
    wherein the unknown rate to fixed rate transmitter is configured to generate the fixed rate data by inserting the unknown rate data into the fixed rate data based upon the clock signal and inserting idle data between portions of the unknown rate data in the fixed rate data so that transmitting the combined unknown rate and idle data at the fixed rate over the fixed rate link results in the unknown rate data being transmitted over the fixed rate link at a rate corresponding to the rate indicated by the clock signal; and
    wherein the fixed rate to unknown rate receiver is configured to accumulate the unknown rate data and generate a recovered clock signal based upon the rate at which the unknown rate data is accumulated by the fixed rate to unknown rate receiver.

2. The system of claim 1, wherein the unknown rate to fixed rate transmitter comprises:
    an unknown rate receiver including an analog front end and circuitry configured to receive input signals transmitted in accordance with a predetermined digital interface standard, and to decode the received signals to obtain the received unknown rate data; and
    a fixed rate transmitter including circuits configured to receive the unknown rate data and the clock signal indicating the rate of the unknown rate data, and to insert idle data between portions of the unknown rate data to create the fixed rate data combining the unknown rate data and the idle data;
    wherein the unknown rate receiver is configured to provide the decoded unknown rate data and the associated clock signal to the fixed rate transmitter; and
    wherein the fixed rate transmitter further includes circuits configured to encode and transmit the fixed rate data combining the unknown rate data and the idle data via the fixed rate link.

3. The system of claim 2, wherein the fixed rate transmitter comprises:
    a first in first out (FIFO) queue into which the unknown rate data is clocked in accordance with the clock signal;
    a multiplexer controlled by a finite state machine, which receives the output of the FIFO queue as an input and an idle data input;
    wherein the fixed rate transmitter is configured to clock the unknown rate data out of the FIFO queue at the rate of the fixed rate link;
    wherein the finite state machine is configured to cause the multiplexer to select data clocked out of the FIFO queue, when there is data in the FIFO queue; and
    wherein the finite state machine is configured to cause the multiplexer to select the idle data sequence, when the FIFO queue is empty.

4. The system of claim 1, wherein the fixed rate to unknown rate receiver comprises:
    a fixed rate receiver including an analog front end and decoder circuitry configured to decode the fixed rate data sequence received by the fixed rate to unknown rate receiver to obtain the data sequence including the combined unknown rate and idle data; and
    a configurable transmitter including circuitry configured to receive the decoded data sequence, accumulate the unknown rate data and generate a recovered clock signal based upon the rate at which the unknown rate data is accumulated;
    wherein the fixed rate receiver is configured to provide the decoded data sequence to the configurable transmitter; and
    wherein the configurable transmitter includes circuitry configured to encode and transmit the accumulated unknown rate data at a rate corresponding to the rate indicated by the recovered clock signal.

5. The system of claim 4, wherein the configurable transmitter comprises:
    a FIFO queue; and
    a phase lock loop;
    wherein the configurable transmitter is configured to accumulate the unknown rate data in the FIFO queue;
    wherein the configurable transmitter is configured to utilize the phase lock loop to generate the recovered clock signal based upon the rate at which the unknown rate data accumulates in the FIFO queue; and
    wherein the configurable transmitter is configured to clock data out of the FIFO queue at the rate indicated by the recovered clock signal.

6. The system of claim 5, wherein the phase lock loop is configured to control the rate of the recovered clock signal based upon whether the amount of unknown rate data accumulated in the FIFO queue is increasing or decreasing.

7. The system of claim 5, wherein the configurable transmitter further comprises:
    a second FIFO queue; and
    a second phase lock loop;
    wherein the configurable transmitter is configured to load the unknown rate data clocked out of the first FIFO queue into the second FIFO queue;
    wherein the configurable transmitter is configured to utilize the second phase lock loop to smooth the recovered clock signal; and wherein the configurable transmitter is configured to clock the unknown rate data out of the second FIFO queue at the rate indicated by the smoothed clock signal.

8. The system of claim 7, wherein the second phase lock loop is implemented as a low jitter clock interpolator.

9. The system of claim 5, wherein the configurable transmitter is configured to reformat the received unknown rate data prior to encoding the reformatted unknown rate data.

10. A fixed rate to unknown rate receiver, comprising:
a fixed rate receiver including an analog front end and decoder circuitry configured to receive and decode a fixed rate data sequence including unknown rate data and idle data; and
a configurable transmitter including circuitry configured to receive the data sequence, accumulate the unknown rate data, and generate a recovered clock signal based upon the rate at which the unknown rate data is accumulated;
wherein the fixed rate receiver is configured to provide the decoded data sequence to the configurable transmitter; and
wherein the configurable transmitter includes circuitry configured to encode and transmit the accumulated unknown rate data at a rate corresponding to the rate indicated by the recovered clock signal.

11. The fixed rate to unknown rate receiver of claim 10, wherein the configurable transmitter comprises:
a FIFO queue; and
a phase lock loop;
wherein the configurable transmitter is configured to accumulate the unknown rate data in the FIFO queue;
wherein the configurable transmitter is configured to utilize the phase lock loop to generate the recovered clock signal based upon the rate at which the unknown rate data accumulates in the FIFO queue; and
wherein the configurable transmitter is configured to clock data out of the FIFO queue at the rate indicated by the recovered clock signal.

12. The fixed rate to unknown rate receiver of claim 11, wherein the phase lock loop is configured to control the rate of the recovered clock signal based upon whether the amount of unknown rate data accumulated in the FIFO is increasing or decreasing.

13. The fixed rate to unknown rate receiver of claim 11, wherein the configurable transmitter further comprises:
a second FIFO queue; and
a second phase lock loop;
wherein the configurable transmitter is configured to load the unknown rate data clocked out of the first FIFO queue into the second FIFO queue;
wherein the configurable transmitter is configured to utilize the second phase lock loop to smooth the recovered clock signal; and
wherein the configurable transmitter is configured to clock the unknown rate data out of the second FIFO queue at the rate indicated by the smoothed recovered clock signal.

14. The fixed rate to unknown rate receiver of claim 13, wherein the second phase lock loop is implemented as a low jitter clock interpolator.

15. The fixed rate to unknown rate receiver of claim 11, wherein the configurable transmitter is configured to reformat the received unknown rate data prior to encoding the reformatted unknown rate data.

16. A method of transmitting unknown rate data and an associated clock signal that indicates the rate of the unknown rate data over a fixed rate link, comprising:
receiving the unknown rate data and the associated clock signal in an unknown rate to fixed rate transmitter;
generating fixed rate data in the unknown rate to fixed rate transmitter by inserting the unknown rate data into the fixed rate data based upon the clock signal and inserting idle data between portions of the unknown rate data, wherein transmission of the fixed rate data including the unknown rate data and the idle data at the fixed rate results in the unknown rate data being transmitted over the fixed rate link at a rate corresponding to the rate indicated by the clock signal;
transmitting the fixed rate data including the unknown rate data and the idle data at a fixed rate over the fixed rate link using the unknown rate to fixed rate transmitter;
receiving the fixed rate data including the unknown rate data and the idle data at a fixed rate to unknown rate receiver;
accumulating the unknown rate data at the fixed rate to unknown rate receiver;
recovering a clock signal based upon the rate at which the unknown rate data is received by the fixed rate to unknown rate receiver; and
transmitting the unknown rate data and the recovered clock signal using the fixed rate to unknown rate receiver.

17. The method of claim 16, wherein the unknown rate to fixed rate transmitter comprises a FIFO queue and a multiplexer configured to select between the output of the FIFO queue and an idle data sequence, the method further comprising:
clocking the unknown rate data into the FIFO queue in accordance with the clock signal;
clocking the unknown rate data out of the FIFO queue at the rate of the fixed rate link;
selecting the output of the FIFO queue as the output of the multiplexer when there is data in the FIFO queue; and
selecting the idle data sequence as the output of the multiplexer when there is no data in the FIFO queue.

18. The method of claim 16, wherein the fixed rate to unknown rate receiver comprises a FIFO queue and a phase lock loop configured to generate a clock signal based upon the rate at which data accumulates in the FIFO queue, the method further comprising:
accumulating the unknown rate data in the FIFO queue;
recovering a clock signal based upon the rate at which data accumulates in the FIFO queue using the phase lock loop; and
clocking data out of the FIFO queue using the recovered clock signal.

19. The method of claim 18, wherein the fixed rate to unknown rate receiver comprises a second FIFO queue and a second phase lock loop configured to reduce jitter in an input clock signal, further comprising:
clocking the data from the first FIFO queue into the second FIFO queue using the recovered clock signal;
generating a smoothed clock signal using the second phase lock loop; and
clocking the data out of the second FIFO queue using the smoothed clock signal.

* * * * *